March 7, 1972 W. MERTENS 3,647,611

INSULATING TAPE FOR PRODUCING AN INSULATING SLEEVE FOR ELECTRICAL CONDUCTORS, IMPREGNATED WITH A THERMOSETTING IMPREGNATION EPOXY RESIN MIXTURE

Filed Aug. 19, 1969

3,647,611
Patented Mar. 7, 1972

1

3,647,611 INSULATING TAPE FOR PRODUCING AN INSULATING SLEEVE FOR ELECTRICAL CONDUCTORS, IMPREGNATED WITH A THERMOSETTING IMPREGNATION EPOXY RESIN MIXTURE

Willi Mertens, Berlin, Germany, assignor to Siemens Aktiengesellschaft, Berlin and Munich, Germany Filed Aug. 19, 1969, Ser. No. 851,411
Claims priority, application Switzerland, Aug. 22, 1968, 12,597
Int. Cl. B32b *5/16, 17/10, 19/02*
U.S. Cl. 161—163 11 Claims

ABSTRACT OF THE DISCLOSURE

As a binder for an accelerator containing mica tape for producing the micalastic insulation, I use polymerizable additives of acid components, containing at least one polymerizable double compound, and epoxide compounds to which organic peroxides are added. This binder is self hardening in the impregnation resin.

To produce insulating tape for electrical conductors that is impregnated with a thermosetting epoxy saturation resin mixture, the use of insulating tapes has been known, wherein mica (fine mica or split mica) is bonded onto a carrier material with a binder which lends itself to chemical installation into the hardening impregnation resin mixture. The binder thereby receives an addition which strongly accelerates the hardening of the resin mixture. The binders used to this end are soft resins which can react to the utmost with the epoxy saturation resin, via epoxy, hydroxyl, sulfhydryl, or carboxyl groups.

These binder accelerator systems cannot harden by themselves or be hardened completely. Although this affords the opportunity to use such tapes for very long periods, the task at hand is, without relinquishing the long serviceability, to find such adhesive resins for the thus produced insulating tapes which can harden of themselves at the hardening temperature of the impregnation resin.

This problem is solved by the present invention with insulating tapes, used to produce an insulating sleeve, impregnated with a thermosetting epoxy impregnation resin mixture for electrical conductors, comprised of a laminar, inorganic material with dielectric strength, and placed upon a flexible substrate, such mica foils or fine-mica layers, which are bonded with the aid of a binder to said substrate or to each other or, if necessary, to a sealing cover layer, and which contain an accelerator which stimulates the hardening reaction of a saturating resin mixture. In accordance with the invention, the binders are polymerizable additions containing at least one polymerizable double compound, and an epoxy compound whose organic peroxides are admixed and which, at a temperature which hardens the impregnation resin, effect a polymerization of the unsaturated molecular regions of the binder and of the accelerator.

The additives which are present in the binder contain hydroxyl groups which serve for activating the thermosetting epoxy resin/acid anhydride/empregnation resin

2 mixtures and through which the binder is installed into the saturation resin. Furthermore, as a result of the added peroxides, the binder is polymerized via its unsaturated molecular regions and via those of the accelerator. Hence, a thus produced binder/accelerator mixture can harden by itself during the hardening process of the impregnation resin which has penetrated into the insulating sleeve. This helps to prevent a binder, which has penetrated between large-area layers of the inorganic material possessing dielectric strength, and which was not fully resorbed by the impregnation resin, remaining unhardened in the insulation. This would otherwise result in higher tan $\delta$ starting values, a stronger and premature rise in the tan $\delta$ along with the temperature, as well as bring about reduction in the mechanical strength, primarily when split mica is used. The binder which is prepared according to the invention provides, on the other hand, good mechanical and electrical qualities for the insulation. Moreover, insulating tapes which contain the binders of the present invention can be processed according to the wet taping method, without the use of a vacuum and with accelerator-free epoxy resin mixtures.

The binders can be further processed with still polymerizable acrylic resin systems or unsaturated polyester resins.

It is preferable to select the lowest possible molecular components for the production of polymerizable adducts in order that the binder will still posses a certain plasticity at room temperature.

The following are suitable as acid components, containing at least one polymerizable double compound, to be used in the production of the binder:

(1) Acid esters comprised of a nonpolymerizable dicarboxylic acid and polymerizable monohydroxy compounds;

(2) Acid esters comprised of an unsaturated polymerizable dicarboxylic acid and nonpolymerizable monohydroxy compound; and (3) Acid esters comprised of an unsaturated polymerizable dicarboxylic acid and polymerizable monohydroxy compounds.

Thus, for example, acid allylmaleinate or allylfumarate, acid allylsuccinate, acid ethylmaleinate or acid ethylfumarate, acid maleinate or succinate of 2-hydroxypropylmethacrylate can be used. In lieu of the succinate, the acid phthalate, tetrahydrophthalate or hexadrophthalate can also be used.

Suitable epoxide compounds for producing the additives which develop the binder are the glycidyl ethers of aliphatic, cycloaliphatic, aromatic or heterocyclic oxy or polyoxy compounds. Glycidyl esters of mono or polycarboxylic acids or epoxy compounds, produced through formation of oxygen at double compounds, can be used.

In addition to the binder, the insulating tape also contains the accelerator for hardening the impregnation resin mixture and the mixture of the impregnation resin with the binder. In addition, the binder can be admixed with zinc salts of unsaturated, polymerizable, acidic compounds. When epoxy resin acid/anhydride mixtures are used as the impregnation resin, compounds with tertiary nitrogen also may be employed to accelerate the hardening process. In this instance, N-glycidyl compounds or compounds with tertiary oxygen which contain epoxy groups are to be used in place of the aforementioned epoxy compounds, for the production of the binder. It is also possible to combine both methods of acceleration.

In order to obtain a selfhardening for the binder/accelerator mixture during the hardening of the impregnation resin, additions of suitable peroxides are necessary in accordance with the invention. The most preferred are such peroxides which begin to dissociate to a notable degree only at rather high temperatures, for example dicumylperoxide and tertiary butylperbenzoate.

The share of the binder should not be too high during the production of the insulation tape so that, during the impregnating process, the impregnation resin can easily penetrate into the hollow spaces present in the tape. Thus, the weight share of the compound used as a binder for gluing the insulating tape should be approximately between 3 and 10%, with respect to the total weight of the insulating tape.

At this content of binder, it is recommended that the amount of the accelerator be approximately in the order of magnitude of 0.1 to 2%, relative to the total weight of the insulating tape. The amount of binder to be added to the insulating tape during the production operation depends on how much inorganic material per substrate is contained in the tape and also on how high a share of binder, used for gluing purposes, is present in the insulating tape.

Figure 1:
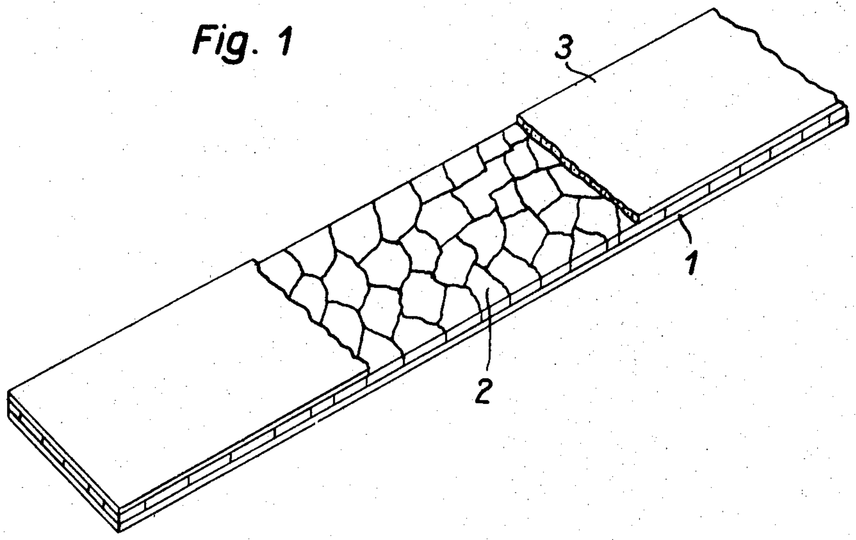
FIG. 1 shows the insulating tape produced according to the invention.

FIG. 1 shows in schematic illustration an insulating tape produced according to the invention. This tape is comprised of a flexible substrate 1 of paper, such as for example Japan paper of a few microns. A web or a synthetic foil, particularly with high heat resistance, may be used as the substrate.

The layer 2, comprised of mica flakes, is placed upon the substrate 1. Mica paper or glass flakes can be used instead of the mica flakes. The layer 2 is sealed by the cover layer 3, which is preferably of the same material as the substrate 1. It is also possible to select different, flexible materials for the substrate 1 and for the cover layer 3. When mica paper is used, the cover layer may be selectively eliminated.

An accelerator containing binder serves for cementing the insulating tape and may be produced as follows: The acidic allylmaleinate is produced at a temperature of between 70 and 100° C., from 223 g. maleic acid/anhydride and 132 g. allylalcohol. The reaction is completed approximately 5 hours later. Subsequently, 22 g. zinc oxide are dissolved in the compound, in an open vessel, accompanied by strong mixing, at about 100° C. The reaction lasts about ½ hour. Into this mixture are added, at approximately 70° C., 340 g. of an epoxy resin on the base of bisglycidylether of bisphenol A, with the epoxy number 0.56–0.58.

The mixture is allowed to react for 5 hours, at a temperature which is not to exceed 100° C. Approximately 710 g. of a soft resin are obtained which becomes pasty at room temperature and which easily dissolves in a mixture of toluene and methylisobutyl ketone, at a ratio of 2:1. If 2% dicumylperoxide is added to the resin and hardened at 130° C., a homogenous molding material is obtained after a few hours, which has a softening temperature of about 95° C. The softening point may be determined according to the method of Martens (see DIN 53 458).

The mechanical and electrical values correspond to those of a good epoxy resin material. The adherence to metal, glass and mica, as well as to a number of technically important synthetic foils, is very good. The mixture of the unhardened resin with 2% dicumylperoxide can be stored unchanged for several months, at room temperature Additions of inhibitors such as hydrochinon, chinhydron or tertiary butylcatechol in an amount of 0.01 to 0.05% improve the storage property.

The thus produced mixture contains the binder and the accelerator at a ratio of 6:1. It is dissolved in an appropriate solvent and applied to the tape in such a way that the share of binder amounts to 3–10% of the weight of the insulating tape. The thus produced insulating tape can be stored without limit.

Figure 2:
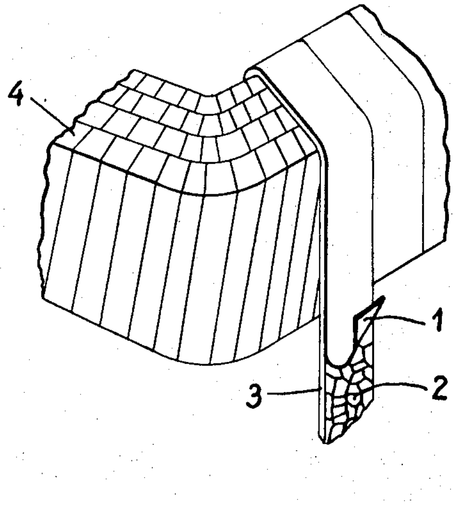
FIG. 2 shows a rod wound with the tape of the invention.

To produce the insulating sleeve of the coil rod of an electrical machine, the insulating tape disclosed in FIG. 1 is wound around the winding rod 4 of an electrical machine as shown in FIG. 2. After the coiled rod 4 has been wrapped with the insulating tape and after the application of an outside mica protection, the thus wrapped rod is impregnated, under vacuum, after a previous drying process, with a thermosetting epoxy saturation mixture on a base of bi- or higher functional glycidyl ethers or epoxy compounds and acid anhydrides. The impregnating temperature amounts thereby to approximately 60 to 70° C., so that there is a guarantee that the viscosity of the epoxy impregnation resin mixture is, if possible, less than 30 cp. during impregnation and, thus, the sleeve which is wound upon the coil rod 4 will be completely saturated. Subsequently, the excess impregnation resin is pumped back. It can frequently be reused since its useful lifetime amounts to a multiple of a period needed for the saturation cycle. During the hardening of the insulating sleeve the special selection of the binder affords the assurance that all places will be hardened, including even those places at which the binder is not resorbed through the impregnation resin, since the binder itself has hardening properties.

I claim:

1. Insulating tape for producing a tape wound insulating jacket to be impregnated with a thermosetting epoxy impregnating resin mixture on the basis of bi- or higher functional glycidylether or epoxy compounds and acid anhydrides, used for electrical conductors, more particularly for the winding rods or coils of electrical machines, said insulating tape comprised of an areal, inorganic material, of dielectric strength, selected from the group of mica flakes, mica foils, mica paper or glass flakes, placed upon a pliable substrate web and bonded to said substrate or with one another or, if necessary, with a sealing cover by a binder, which constitutes 3–10% by weight of the tape and which contains an accelerator, polymerizable with the binder, made by reaction of zinc oxide with unsaturated, polymerizable acidic compounds, that stimulate the hardening reaction of the epoxy impregnating resin mixture, said binder comprising a polymerizable adduct of acidic components and epoxy compounds which contain at least one polymerizable double bond, to which organic peroxides are added, which effect the polymerization of the unsaturated molecular regions of the binder and of the accelerator at a hardening temperature of the epoxy impregnating resin.

2. Insulating tape according to claim 1, wherein the adducts used as a binder are of low molecular weight components.

3. The insulating tape of claim 1, wherein acidic esters of a nonpolymerizable dicarboxylic acid and polymerizable monohydroxy compounds are used as the acid component, which contains at least one polymerizable double compound, for the production of the binder.

4. The insulating tape of claim 1, wherein the acid component containing at least one polymerizable double compound, which is used for the production of the binder, is constituted by acidic ester of a nonsaturated polymerizable dicarboxylic acid and nonpolymerizable monohydroxy compound.

5. The insulating tape of claim 1, wherein the acidic esters comprised of an unsaturated polymerizable dicarboxylic acid and polymerizable monohydroxy compounds are used as an acid component, containing at least one polymerizable double compound, for producing the binder.

6. The insulating tape of claim 1, wherein the epoxy compound for producing the polymerizable adducts which form the binder are glycidyl ethers of aliphatic, cycloaliphatic, aromatic or heterocyclic oxy or polyoxy compounds.

7. The insulation tape of claim 1, wherein the epoxy compounds used to produce the polymerizable adducts which form the binder, the glycidyl esters of mono or polycarboxylic acids.

8. The insulation tape of claim 1, wherein N-glycidyl compounds or epoxy compounds containing a tertiary nitrogen atom are used as epoxy compounds for producing the polmerizable adducts which form the binder.

9. The insulation tape of claim 1, wherein epoxy compounds which resulted from a deposition of oxygen at the double compounds are used to produce the polymerizable adducts which form the binder.

10. The insulation tape of claim 1, wherein dicumylperoxide is added to the binder.

11. The insulation tape of claim 1, wherein tertiary butylperbenzoate is admixed with the binder.

References Cited

UNITED STATES PATENTS

| | | | |
|---|---|---|---|
| 3,150,118 | 9/1964 | Clemens | 260—78.4 |
| 3,254,150 | 5/1966 | Rogers | 161—163 |
| 3,367,992 | 2/1968 | Bearden | 260—837 |
| 3,373,075 | 3/1968 | Fekete et al. | 161—185 |
| 3,425,961 | 2/1969 | Jellinek et al. | 260—78.4 |

HAROLD ANSHER, Primary Examiner

G. W. MOXON II, Assistant Examiner

U.S. Cl. X.R.

117—122 PB; 161—171, 184, 185; 260—78.4 EP